United States Patent
Hengriprasopchoke et al.

(10) Patent No.: US 6,510,987 B1
(45) Date of Patent: Jan. 28, 2003

(54) AUTOMATED MONITORING OF ESD (ELECTRO STATIC DISCHARGE) OF EACH OF A PLURALITY OF OPERATORS IN A PRODUCTION AREA

(75) Inventors: Anuchit Hengriprasopchoke, Amphur Pakkred (TH); Kamphon Suewonsuwan, Chonburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 325 days.

(21) Appl. No.: 09/633,399

(22) Filed: Aug. 7, 2000

(51) Int. Cl.⁷ ................................................. G06K 5/00
(52) U.S. Cl. ........................ 235/380; 702/123; 702/182; 340/649
(58) Field of Search .................. 235/380, 376, 235/435; 340/649–652; 324/510; 361/212, 220; 702/123, 101, 82

(56) References Cited

U.S. PATENT DOCUMENTS

| | | | | |
|---|---|---|---|---|
| 4,800,374 A | * | 1/1989 | Jacobson | 324/509 |
| 5,083,117 A | * | 1/1992 | Hoigaard | 324/510 |
| 5,359,319 A | * | 10/1994 | Campbell et al. | 324/457 |
| 5,422,630 A | * | 6/1995 | Quinn et al. | 324/538 |
| 5,991,145 A | * | 11/1999 | Lagrotta et al. | 361/212 |
| 6,028,761 A | * | 2/2000 | Cooter | 340/649 |
| 6,078,875 A | * | 6/2000 | Jubin et al. | 324/500 |
| 6,150,945 A | * | 11/2000 | Wilson | 324/457 |
| 6,205,408 B1 | * | 3/2001 | Jubin et al. | 324/557 |
| 6,396,255 B2 | * | 5/2002 | Karins et al. | 324/102 |

* cited by examiner

Primary Examiner—Michael G. Lee
Assistant Examiner—Daniel Walsh
(74) Attorney, Agent, or Firm—Monica H. Choi

(57) ABSTRACT

A computer system is used for monitoring that each of a plurality of operators assigned to work during a predetermined work shift has checked into a production area and has measured the ESD (electro static discharge) from the body of the operator at an ESD (electro static discharge) measuring unit. A database stores data regarding a plurality of operators working in the production area, and the computer system includes a data processor for generating a list of operators assigned to work during a predetermined work shift from data stored in the database. A respective badge identification of each operator who checks into the production area is stored in a first working file, and a respective badge identification of each operator who measures a respective amount of ESD (electro static discharge) from the body of the operator is stored in a second working file, of the data storage unit of the computer system. The data processor searches through the first working file and the second working file to assign respective flag(s) to each operator in the list of operators to indicate whether the operator has checked into the production area, whether the operator has measured the ESD (electro static discharge), and whether the measured ESD (electro static discharge) is greater than a predetermined ESD (electro static discharge) level. Reports are generated with such flag(s) such that a supervisor may easily identify an operator who has not measured the ESD (electro static discharge) at the start of the predetermined work shift and an operator who consistently has measured ESD (electro static discharge) levels that are greater than the predetermined ESD (electro static discharge) level.

15 Claims, 3 Drawing Sheets

AUTOMATED MONITORING OF ESD (ELECTRO STATIC DISCHARGE) OF EACH OF A PLURALITY OF OPERATORS IN A PRODUCTION AREA

TECHNICAL FIELD

The present invention relates generally to production of articles of manufacture that are sensitive to ESD (electro static discharge) such as IC (integrated circuit) packages, and more particularly, to a method and system for automatically monitoring the amount of ESD (electro static discharge) from each of a plurality of operators in a production area to minimize damage to the articles of manufacture caused by ESD (electro static discharge) from the plurality of operators.

BACKGROUND OF THE INVENTION

Referring to FIG. 1, an IC (integrated circuit) package 10 is an example article of manufacture that may be damaged during production by ESD (electro static discharge) from an operator. The IC package 10 includes a housing 12 for carrying an IC (integrated circuit) die 14 therein, as known to one of ordinary skill in the art of IC package manufacture. The IC package 10 also includes a plurality of leads 22, 24, 26, 28, and 30 for providing connection to nodes of the integrated circuit fabricated on the IC die 14, as known to one of ordinary skill in the art of IC package manufacture. A typical IC package has more numerous leads, but five leads 22, 24, 26, 28, and 30 are shown in FIG. 1 for clarity of illustration.

During production of IC packages, operators handle such IC packages in a production area for manufacture of the IC packages. An operator when in the production area for manufacture of IC packages typically wears specially made footwear that is amenable for dissipating charge from the operator to the ground for minimizing electro static charge accumulation on the operator. However, an unacceptable level of electro static charge may accumulate on the operator. When such an operator touches an IC package, an unacceptable level of ESD (electro static discharge) may be passed to the IC die of the IC package resulting in permanent damage to the IC die of the IC package.

Thus, referring to FIG. 2, an operator 50 is instructed to measure the amount of ESD (electro static discharge) from the operator 50 before entering a production area at the start of a work shift. The operator 50 measures the amount of ESD (electro static discharge) from the body of the operator 50 at an ESD (electro static discharge) measuring unit 52. The operator 50 stands on a charge dissipating mat 54 that is coupled to a ground node of the ESD measuring unit 52. The charge dissipating mat 54 is typically comprised of a conductive material, and footwear 56 of the operator 50 makes contact with the charge dissipating mat 54. The operator 50 then places a hand 58 to a measuring node of the ESD measuring unit 52.

In this manner, the ESD measuring unit 52 determines a resistance of the operator 50 from the hand 58 to the footwear 56 of the operator 50. Such resistance correlates to the ESD (electro static discharge) from the body of the operator 50. An example of such an ESD measuring unit 52 that is available to one of ordinary skill in the art of IC package manufacture has the model number of SP-30110-SPI from SPI (Static Prevention Incorporated) located in Brea, Calif.

In the prior art, each of a plurality of operators assigned to work during a predetermined work shift is instructed to measure the ESD (electro static discharge) from the body of the operator and to manually record the result on a chart toward the start of the predetermined work shift. In the prior art, a production supervisor examines the chart toward the start of the predetermined work shift to identify any operator having an unacceptable level of ESD (electro static discharge). In addition, in the prior art, another employee gathers the daily charts for the prior month to manually create a monthly report that summarizes the ESD (electro static discharge) measured for each of the operators. The production supervisor examines the monthly report to identify any operator consistently having an unacceptable level of ESD (electro static discharge) for the prior month such that such an operator may be advised to replace his/her footwear.

However, in the prior art, some of the operators forget or fail to measure the ESD (electro static discharge) on a daily basis. Thus, unacceptable levels of ESD (electro static discharge) from some operators are not detected resulting in damage to the IC dies during production of IC packages. In addition, time and labor is wasted when the employee gathers the daily charts for the prior month to manually create the monthly report in the prior art. Furthermore, some daily charts are misplaced resulting in incomplete monthly reports of the ESD (electro static discharge) measured for each of the operators.

Thus, a mechanism is desired for automatically monitoring that each of a plurality of operators in a production area measures the ESD (electro static discharge) and for automatically recording the ESD (electro static discharge) measured from each of the plurality of operators. With such complete measuring and recording of the ESD (electro static discharge) from each of the plurality of operators, reports generated from such data may be used to effectively minimize damage to the articles of manufacture caused by ESD (electro static discharge) from the plurality of operators.

SUMMARY OF THE INVENTION

Accordingly, in a general aspect of the present invention, a computer system is used for monitoring that each of a plurality of operators assigned to work during a predetermined work shift has checked into the production area and has measured the ESD (electro static discharge) at an ESD (electro static discharge) measuring unit.

In a general aspect of the present invention, a first identification reader reads a respective badge identification of each operator who checks into the production area. A computer system has a data storage unit for storing the respective badge identification of each operator who checks into the production area in a first working file. An ESD (electro static discharge) measuring unit measures an amount of ESD (electro static discharge) from the body of an operator, and a second identification reader reads a respective badge identification of each operator who measures a respective amount of ESD (electro static discharge) from the body of the operator at the ESD (electro static discharge) measuring unit. The respective badge identification and the respective amount of ESD measured for each operator who measures the respective amount of ESD at the ESD measuring unit are stored in a second working file of the data storage unit of the computer system.

A database stores data regarding a plurality of operators working in the production area, and the computer system includes a data processor for generating a list of operators assigned to work during a predetermined work shift from data stored in the database, at a start of the predetermined work shift. The data processor of the computer system assigns a respective flag to each operator in the list of operators assigned to work during the predetermined work shift, at the start of the predetermined work shift, by processing data from the first working file and the second working file stored in the data storage unit of the computer system.

In addition, the data processor assigns a first flag to an operator if a respective badge identification of the operator is recorded in the first working file indicating that the operator has checked into the production area, and if the respective badge identification of the operator is recorded in the second working file indicating that the operator has measured a respective amount of ESD (electro static discharge) from the body of the operator at an ESD (electro static discharge) measuring unit. The data processor assigns a second flag to an operator if a respective badge identification of the operator is not recorded in the first working file indicating that the operator has not checked into the production area, and if the respective badge identification of the operator is recorded in the second working file indicating that the operator has measured a respective amount of ESD (electro static discharge) from the body of the operator at an ESD (electro static discharge) measuring unit. Furthermore, the data processor assigns a third flag to an operator if a respective badge identification of the operator is recorded in the first working file indicating that the operator has checked into the production area, and if the respective badge identification of the operator is not recorded in the second working file indicating that the operator has not measured a respective amount of ESD (electro static discharge) from the body of the operator at an ESD (electro static discharge) measuring unit. Finally, the data processor assigns a fourth flag to an operator if a respective badge identification of the operator is not recorded in the first working file indicating that the operator has not checked into the production area, and if the respective badge identification of the operator is not recorded in the second working file indicating that the operator has not measured a respective amount of ESD (electro static discharge) from the body of the operator at an ESD (electro static discharge) measuring unit.

In another embodiment of the present invention, the respective flag assigned to each operator with the predetermined work shift and a date of the predetermined work shift is stored in the database. A daily report is generated, at one of a plurality of computer systems networked in the production area and coupled to the database, with the respective flag assigned to each operator for the list of operators, at the start of the predetermined work shift. Furthermore, a monthly report is generated, at one of the plurality of computer systems networked in the production area and coupled to the database, with the respective flag assigned to each operator for the list of operators, for each date of the predetermined work shift during a prior month, from data stored in the database.

In this manner, the daily report readily identifies any operator who has failed to measure the ESD (electro static discharge) such that the production supervisor may further instruct such an operator to measure the ESD (electro static discharge). The monthly report readily identifies any operator who consistently has an unacceptable level of ESD (electro static discharge) for the prior month such that the production supervisor may instruct such an operator to replace his/her footwear. Thus, damage may effectively be minimized to the articles of manufacture caused by ESD (electro static discharge) from the plurality of operators.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, and 4 refer to elements having similar structure and function.

DETAILED DESCRIPTION

Figure 3:
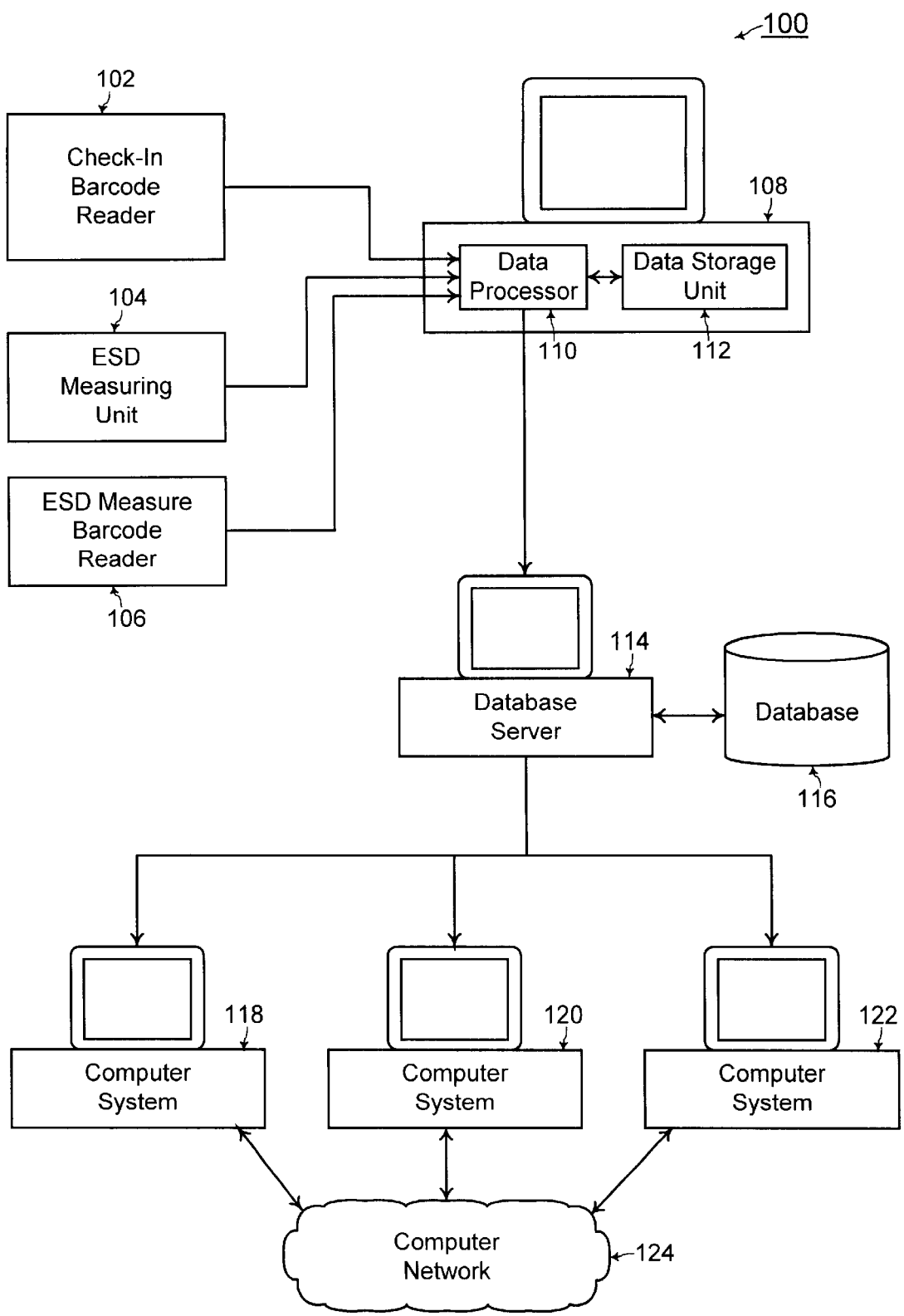
FIG. 3 shows components of a system for automatically monitoring that the level of ESD (electro static discharge) is measured from each of a plurality of operators during each work shift in a production area, according to one embodiment of the present invention.

Referring to FIG. 3, a system 100 for automatically monitoring that the level of ESD (electro static discharge) is measured from each of a plurality of operators during each work shift in a production area includes a check-in barcode reader 102. The check-in barcode reader 102 reads the badge identification number of an operator from a badge of the operator when the operator checks into the production area at the start of a work shift. Barcode readers are known to one of ordinary skill in the art of electronics.

Figure 1:
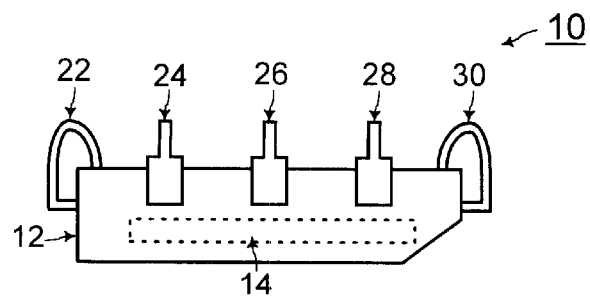
FIG. 1 shows the components of a typical IC (integrated circuit) package having an IC (integrated circuit) die that may be damaged from an unacceptable level of ESD (electro static discharge) from an operator.
Figure 2:
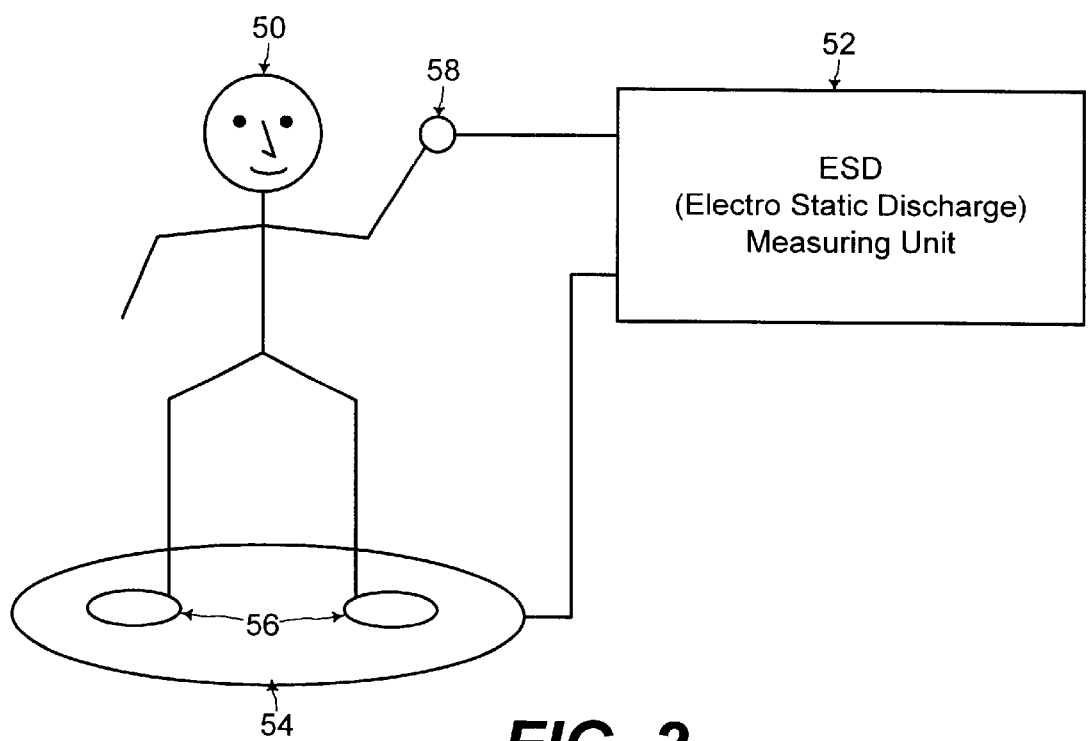
FIG. 2 shows an operator measuring the level of ESD (electro static discharge) from the operator at an ESD (electro static discharge) measuring unit.

The system 100 also includes an ESD (electro static discharge) measuring unit 104 for measuring the level of ESD (electro static discharge) from an operator. As described herein with reference to FIG. 3, the ESD measuring unit 104 of FIG. 3 is similar to the ESD measuring unit 52 of FIG. 2 that determines a resistance of the operator 50 from the hand 58 to the footwear 56 of the operator 50. Such resistance correlates to the ESD (electro static discharge) from the body of the operator 50. An example of such an ESD measuring unit 100 that is available to one of ordinary skill in the art of IC package manufacture has the model number of SP-30110-SPI from SPI (Static Prevention Incorporated) located in Brea, Calif.

The system 100 further includes an ESD (electro static discharge) measure barcode reader 106 that reads the badge identification number of an operator from a badge of the operator when the operator measures the ESD (electro static discharge) at the ESD measuring unit 104. Barcode readers are known to one of ordinary skill in the art of electronics.

The system 100 includes a computer system 108 having a data processor 110 and a data storage unit 112. General data processor units and data storage units within computer systems are known to one of ordinary skill in the art of electronics. The check-in barcode reader 102, the ESD measuring unit 104, and the ESD measure barcode reader 106 are coupled to the data processor 110 of the computer system 108. In addition, the data processor 110 is coupled to a database server 114 that maintains the data stored in a database 116. The database 116 stores data relating to a plurality of operators working in a production area for manufacture of IC (integrated circuit) packages such as the names and the badge identification numbers of operators assigned to work during each work shift.

In the system 100, the database server 114 is coupled to a plurality of computer systems including a first computer system 118, a second computer system 120, and a third computer system 122 that are disposed at various locations of the production area for manufacture of IC (integrated circuit) packages. The plurality of computer systems 118, 120, and 122 are coupled together via a computer network 124. Technologies such as LAN (local area network) for networking the plurality of computers 118, 120, and 122 are known to one of ordinary skill in the art of electronics.

Toward the start of a predetermined work shift in a production area, each of a plurality of operators scheduled to work during the predetermined work shift is instructed to check into the production area by having the check-in barcode reader 102 read the badge identification of the operator. The check-in barcode reader 102 stores the badge identification of each operator who checks into the production area by having the check-in barcode reader 102 read the badge identification of the operator.

Furthermore, toward the start of the predetermined work shift, each of a plurality of operators scheduled to work during the predetermined work shift is instructed to measure the ESD (electro static discharge) from the operator at the ESD measuring unit 104 and to have the ESD measure barcode reader 106 read the badge identification of the operator. The ESD measure barcode reader 106 stores the badge identification of each operator who measures the ESD (electro static discharge) from the operator at the ESD measuring unit 104. In addition, the ESD measuring unit 104 stores the level of ESD (electro static discharge) measured for each operator.

Figure 4:
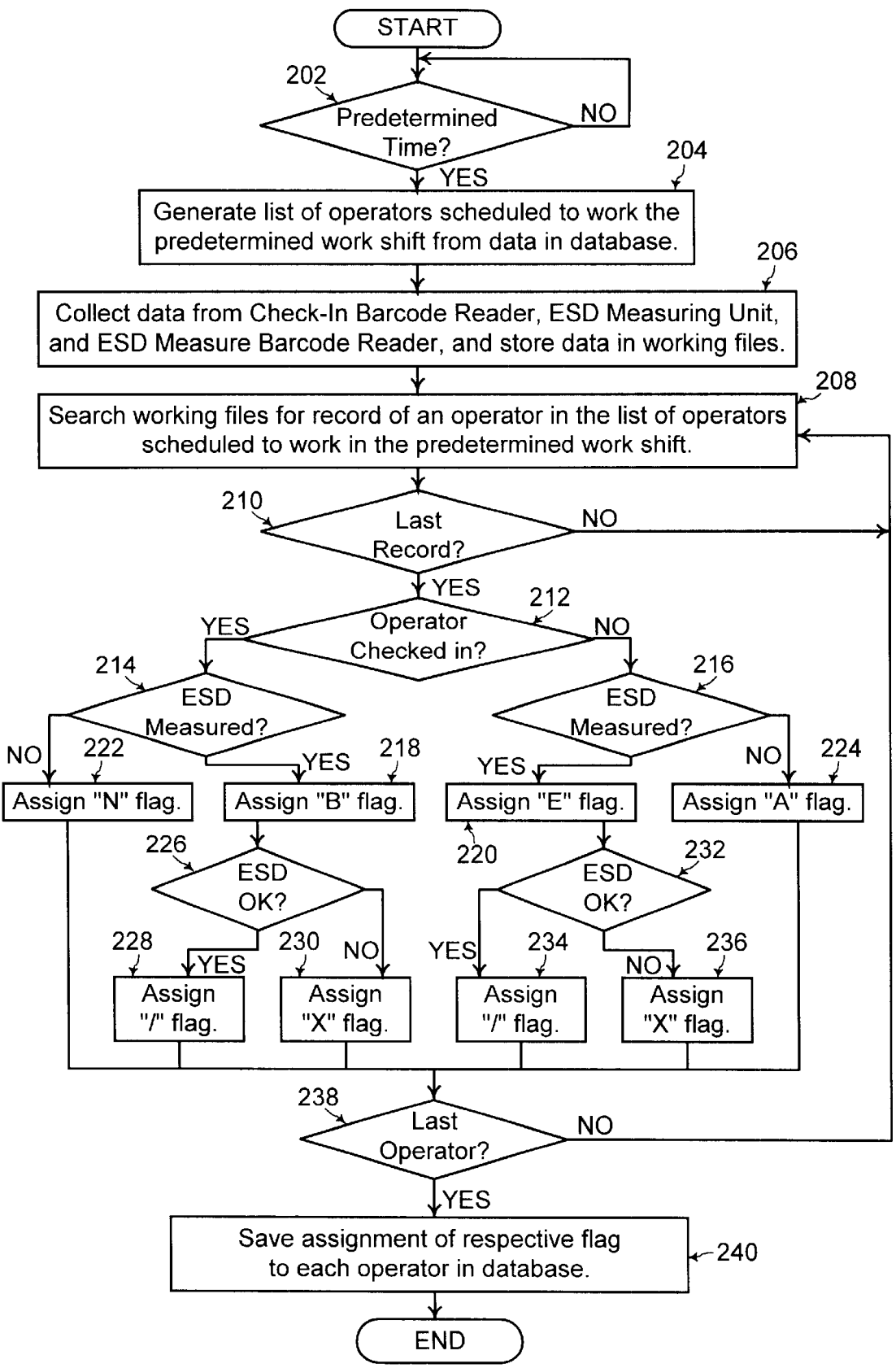
FIG. 4 shows a flowchart for illustrating the steps of operation of the system of FIG. 3 for automatically monitoring that the level of ESD (electro static discharge) is measured from each of a plurality of operators during each work shift in the production area, according to one embodiment of the present invention.

The data processor 110 of the computer system 108 automatically monitors that each operator scheduled to work during the predetermined work shift measures the ESD (electro static discharge) at the ESD measuring unit 104 by performing the steps of operation of the flowchart of FIG. 4. Referring to FIG. 4, the data processor 110 initially waits for the start of the predetermined work shift by monitoring for a predetermined time that marks the start of the predetermined work shift in a work day (step 202 in FIG. 4).

At that predetermined time which marks the start of the predetermined work shift, the data processor 110 generates a list of operators scheduled to work during the predetermined work shift from data stored in the database 116 (step 204 in FIG. 4). The database 116 contains data relating to substantially all of the operators working in the production area including the work shift scheduled for each operator and the badge identification for each operator. The data processor 110 queries the database server 114 for the list of operators scheduled to work during the predetermined work shift and for the respective badge identification for each of such operators from data stored in the database 116. Technologies for such a database server 114 and such a database 116 are known to one of ordinary skill in the art of electronics such as database applications available from Oracle Corporation located in Redwood Shores, Calif.

The data processor 110 then collects the badge identification data from the check-in barcode reader 102 and the ESD measure barcode reader 106 and the level of ESD (electro static discharge) data from the ESD measuring unit 104 (step 206 of FIG. 4). Technologies for sending data from the check-in barcode reader 102, the ESD measuring unit 104, and the ESD measure barcode reader 106 to the data processor 110 are known to one of ordinary skill in the art of electronics.

The data processor 110 stores the respective badge identification of each operator who checked into the production area by having the check-in barcode reader 102 read the badge identification of the operator in a first working file in the data storage unit 112 of the computer system 108. In addition, the data processor 110 stores the badge identification and the level of the ESD (electro static discharge) for each operator who had the ESD (electro static discharge) measured at the ESD measuring unit 104 in a second working file in the data storage unit 112 of the computer system 108.

Referring to FIG. 4, for each operator in the list of operators scheduled to work during the predetermined work shift, the data processor 110 searches the first working file and the second working file in the data storage unit 112 for the record of the respective badge identification of the operator (step 208 of FIG. 4). Because an operator may check in by having the check-in barcode reader 102 read the badge identification of the operator multiple times or because an operator may measure the level of ESD (electro static discharge) at the ESD measuring unit 104 multiple times, the data processor searches for the last occurrence of the respective badge identification of the operator in the first working file and the second working file in the data storage unit 112 (step 210 of FIG. 4).

If the respective badge identification of the operator is recorded in the first working file, then that operator has checked into the production area (step 212 of FIG. 4). If the respective badge identification of the operator is not recorded in the first working file, then that operator has not checked into the production area (step 212 of FIG. 4).

If the respective badge identification of the operator is recorded in the second working file, then that operator has measured the level of ESD (electro static discharge) at the ESD measuring unit 104 (steps 214 and 216 of FIG. 4). If the respective badge identification of the operator is not recorded in the second working file, then that operator has not measured the level of ESD (electro static discharge) at the ESD measuring unit 104 (steps 214 and 216 of FIG. 4).

The data processor 110 assigns a "B" flag to an operator if a respective badge identification of the operator is recorded in the first working file indicating that the operator has checked into the production area, and if the respective badge identification of the operator is recorded in the second working file indicating that the operator has measured a respective amount of ESD (electro static discharge) of the operator (step 218 of FIG. 4). With the "B" flag, the operator has properly checked into the production area for the predetermined work shift and has properly measured the ESD (electro static discharge) of the operator.

The data processor 110 assigns an "E" flag to an operator if a respective badge identification of the operator is not recorded in the first working file indicating that the operator has not checked into the production area, and if the respective badge identification of the operator is recorded in the second working file indicating that the operator has measured a respective amount of ESD (electro static discharge) of the operator (step 220 of FIG. 4). With the "E" flag, the operator has properly measured the ESD (electro static discharge) of the operator, but has not checked into the production area for the predetermined work shift indicating that the operator may be working over-time.

The data processor 110 assigns an "N" flag to an operator if a respective badge identification of the operator is recorded in the first working file indicating that the operator has checked into the production area, and if the respective badge identification of the operator is not recorded in the second working file indicating that the operator has not measured a respective amount of ESD (electro static discharge) from the body of the operator (step 222 of FIG. 4). With the "N" flag, the operator has properly checked into the production area for the predetermined work shift, but has not properly measured the ESD (electro static discharge) of the operator. In that case, the production supervisor may further instruct the operator to measure the ESD (electro static discharge) of the operator.

The data processor 110 assigns an "A" flag to an operator if a respective badge identification of the operator is not recorded in the first working file indicating that the operator has not checked into the production area, and if the respective badge identification of the operator is not recorded in the second working file indicating that the operator has not measured a respective amount of ESD (electro static discharge) from the operator (step 224 of FIG. 4). Thus, the "A" flag indicates that the operator is likely to be absent from the predetermined work shift by taking a sick day, a vacation day, etc.

If the "B" flag is assigned to the operator, the data processor 110 further checks whether the level of the ESD (electro static discharge) measured for the operator is greater than a predetermined ESD (electro static discharge) level (step 226 of FIG. 4). The data processor 110 assigns a "/" flag to the operator if the respective amount of ESD (electro static discharge) from the body of the operator is less than the predetermined ESD (electro static discharge) level when the respective amount of ESD (electro static discharge) from the body of the operator is not likely to damage the IC dies during the manufacture of IC packages (step 228 of FIG. 4). On the other hand, the data processor 110 assigns a "X" flag to the operator if the respective amount of ESD (electro static discharge) from the body of the operator is greater than the predetermined ESD (electro static discharge) level when the respective amount of ESD (electro static discharge) from the body of the operator is likely to damage the IC dies during the manufacture of IC packages (step 230 of FIG. 4).

If the "E" flag is assigned to the operator, the data processor 110 further checks whether the level of the ESD (electro static discharge) measured for the operator is greater than the predetermined ESD (electro static discharge) level (step 232 of FIG. 4). The data processor 110 assigns a "/" flag to the operator if the respective amount of ESD (electro static discharge) from the body of the operator is less than the predetermined ESD (electro static discharge) level when the respective amount of ESD (electro static discharge) from the body of the operator is not likely to damage the IC dies during the manufacture of IC packages (step 234 of FIG. 4). On the other hand, the data processor 110 assigns a "X" flag to the operator if the respective amount of ESD (electro static discharge) from the body of the operator is greater than the predetermined ESD (electro static discharge) level when the respective amount of ESD (electro static discharge) from the body of the operator is likely to damage the IC dies during the manufacture of IC packages (step 236 of FIG. 4).

In this manner, respective flag(s) are set for the operator in the list of operators scheduled to work during the predetermined work shift to indicate whether the operator has checked into the production area, whether the operator has measured the ESD (electro static discharge), and whether the measured ESD (electro static discharge) is greater than the predetermined ESD (electro static discharge) level. The respective flag(s) are set for each operator in the list of operators by the data processor 110. Thus, the data processor 110 repeats the steps of assigning the respective flags to each operator until the last operator is reached for the list of operators scheduled to work during the predetermined work shift (step 238 of FIG. 4).

When the respective flag(s) are set for each operator in the list of operators scheduled to work during the predetermined work shift, the data processor 110 saves the assignment of the respective flag(s) for each operator in the database 116 (step 240 of FIG. 4). With such data stored in the database 116, one of the plurality of computer systems 118, 120, and 122 generates a daily report with the respective flag(s) assigned to each operator for the list of operators at the start of the predetermined work shift.

With such a daily report, the production supervisor may easily identify an operator who has not measured the ESD (electro static discharge) to instruct such an operator to measure the ESD (electro static discharge) at the start of the work shift. In addition, with such a daily report, the production supervisor may easily identify an operator who has a measured ESD (electro static discharge) level that is greater than the predetermined ESD (electro static discharge) level to instruct such an operator to replace his/her footwear for generating less ESD (electro static discharge).

Furthermore, with such data stored in the database 116, one of the plurality of computer systems 118, 120, and 122 generates a monthly report with the respective flag(s) assigned to each operator for the list of operators for each date of the predetermined work shift during a prior month. With such a monthly report, the production supervisor may easily identify any operator consistently having an unacceptable level of ESD (electro static discharge) for the prior month such that such an operator may be advised to replace his/her footwear for generating less ESD (electro static discharge).

The foregoing is by way of example only and is not intended to be limiting. For example, the present invention is described with the barcode readers 102 and 106 as example badge identification reading devices. However, the present invention may be used with other types of badge identification reading devices such as magnetic strip reading devices, as would be apparent to one of ordinary skill in the art from the description herein. In addition, the present invention is described for protection of IC dies during manufacture of IC packages. However, the present invention may be used during production of other types of articles of manufacture, as would be apparent to one of ordinary skill in the art from the description herein. Furthermore, the flag characters specified herein are by way of example, and the present invention may be used with any other types of flag characters, as would be apparent to one of ordinary skill in the art from the description herein.

The present invention is limited only as defined in the following claims and equivalents thereof.

We claim:

1. A method for monitoring ESD (electro static discharge) from each operator in a production area during production of articles of manufacture, the method including the steps of:

reading a respective badge identification of each operator who checks into said production area;

storing said respective badge identification of each operator who checks into said production area in a first working file of a computer system;

reading a respective badge identification of each operator who measures a respective amount of ESD (electro static discharge) from a body of said operator at an ESD (electro static discharge) measuring unit;

storing said respective badge identification and said respective amount of ESD measured for each operator who measures said respective amount of ESD at said ESD measuring unit in a second working file of said computer system;

generating by said computer system a list of operators assigned to work during a predetermined work shift from data stored in a database including data regarding a plurality of operators working in said production area, at a start of said predetermined work shift; and assigning by said computer system a respective flag to each operator in said list of operators assigned to work during said predetermined work shift, at said start of said predetermined work shift, by processing data from said first working file and said second working file of said computer system as follows:

assigning a first flag to an operator if a respective badge identification of said operator is recorded in said first working file indicating that said operator has checked into said production area, and if said respective badge identification of said operator is recorded in said second working file indicating that said operator has measured a respective amount of ESD (electro static discharge) from the body of said operator at an ESD (electro static discharge) measuring unit;

assigning a second flag to an operator if a respective badge identification of said operator is not recorded in said first working file indicating that said operator has not checked into said production area, and if said respective badge identification of said operator is recorded in said second working file indicating that said operator has measured a respective amount of ESD (electro static discharge) from the body of said operator at an ESD (electro static discharge) measuring unit;

assigning a third flag to an operator if a respective badge identification of said operator is recorded in said first working file indicating that said operator has checked into said production area, and if said respective badge identification of said operator is not recorded in said second working file indicating that said operator has not measured a respective amount of ESD (electro static discharge) from the body of said operator at an ESD (electro static discharge) measuring unit; and assigning a fourth flag to an operator if a respective badge identification of said operator is not recorded in said first working file indicating that said operator has not checked into said production area, and if said respective badge identification of said operator is not recorded in said second working file indicating that said operator has not measured a respective amount of ESD (electro static discharge) from the body of said operator at an ESD (electro static discharge) measuring unit.

2. The method of claim 1, wherein when said first flag is assigned to said operator, the method further includes the steps of:

assigning a fifth flag to said operator if said respective amount of ESD (electro static discharge) from the body of said operator is less than a predetermined ESD (electro static discharge) level such that said respective amount of ESD (electro static discharge) from the body of said operator is not likely to damage said articles of manufacture; and assigning a sixth flag to said operator if said respective amount of ESD (electro static discharge) from the body of said operator is greater than a predetermined ESD (electro static discharge) level such that said respective amount of ESD (electro static discharge) from the body of said operator is likely to damage said articles of manufacture.

3. The method of claim 2, wherein when said second flag is assigned to said operator, the method further includes the steps of:

assigning a seventh flag to said operator if said respective amount of ESD (electro static discharge) from the body of said operator is less than a predetermined ESD (electro static discharge) level such that said respective amount of ESD (electro static discharge) from the body of said operator is not likely to damage said articles of manufacture; and assigning an eighth flag to said operator if said respective amount of ESD (electro static discharge) from the body of said operator is greater than a predetermined ESD (electro static discharge) level such that said respective amount of ESD (electro static discharge) from the body of said operator is likely to damage said articles of manufacture.

4. The method of claim 1, further including the step of:

storing said respective flag assigned to each operator with said predetermined work shift and a date of said predetermined work shift in said database.

5. The method of claim 4, further including the step of:

generating, at one of a plurality of computer systems networked in said production area and coupled to said database, a report with said respective flag assigned to each operator for said list of operators from data stored in said database, at said start of said predetermined work shift.

6. The method of claim 4, further including the step of:

generating, at one of a plurality of computer systems networked in said production area and coupled to said database, a report with said respective flag assigned to each operator for said list of operators, for each date of said predetermined work shift during a prior month, from data stored in said database.

7. The method of claim 1, wherein said articles of manufacture includes an IC (integrated circuit) package having an IC (integrated circuit) die that is damaged if an amount of ESD (electro static discharge) from an operator to said IC die is greater than a predetermined ESD (electro static discharge) level.

8. A method for monitoring ESD (electro static discharge) from each operator in a production area during production of IC (integrated circuit) packages, the method including the steps of:

reading by a first bar code reader a respective badge identification of each operator who checks into said production area;

storing said respective badge identification of each operator who checks into said production area in a first working file of a computer system;

reading by a second bar code reader a respective badge identification of each operator who measures a respective amount of ESD (electro static discharge) from a body of said operator at an ESD (electro static discharge) measuring unit;

storing said respective badge identification and said respective amount of ESD measured for each operator who measures said respective amount of ESD at said ESD measuring unit in a second working file of said computer system;

generating by said computer system a list of operators assigned to work during a predetermined work shift from data stored in a database including data regarding a plurality of operators working in said production area, at a start of said predetermined work shift; and assigning by said computer system a respective flag to each operator in said list of operators assigned to work during said predetermined work shift, at said start of said predetermined work shift, by processing data from said first working file and said second working file of said computer system as follows:

assigning a first flag to an operator if a respective badge identification of said operator is recorded in said first working file indicating that said operator has checked into said production area, and if said respective badge identification of said operator is recorded in said second working file indicating that said operator has measured a respective amount of ESD (electro static discharge) from the body of said operator at an ESD (electro static discharge) measuring unit;

assigning a second flag to an operator if a respective badge identification of said operator is not recorded in said first working file indicating that said operator has not checked into said production area, and if said respective badge identification of said operator is recorded in said second working file indicating that said operator has measured a respective amount of ESD (electro static discharge) from the body of said operator at an ESD (electro static discharge) measuring unit;

assigning a third flag to an operator if a respective badge identification of said operator is recorded in said first working file indicating that said operator has checked into said production area, and if said respective badge identification of said operator is not recorded in said second working file indicating that said operator has not measured a respective amount of ESD (electro static discharge) from the body of said operator at an ESD (electro static discharge) measuring unit; and assigning a fourth flag to an operator if a respective badge identification of said operator is not recorded in said first working file indicating that said operator has not checked into said production area, and if said respective badge identification of said operator is not recorded in said second working file indicating that said operator has not measured a respective amount of ESD (electro static discharge) from the body of said operator at an ESD (electro static discharge) measuring unit;

wherein when said first flag is assigned to said operator, the method further includes the steps of:

assigning a fifth flag to said operator if said respective amount of ESD (electro static discharge) from the body of said operator is less than a predetermined ESD (electro static discharge) level such that said respective amount of ESD (electro static discharge) from the body of said operator is not likely to damage said IC (integrated circuit) packages; and assigning a sixth flag to said operator if said respective amount of ESD (electro static discharge) from the body of said operator is greater than a predetermined ESD (electro static discharge) level such that said respective amount of ESD (electro static discharge) from the body of said operator is likely to damage said IC (integrated circuit) packages;

wherein when said second flag is assigned to said operator, the method further includes the steps of:

assigning a seventh flag to said operator if said respective amount of ESD (electro static discharge) from the body of said operator is less than a predetermined ESD (electro static discharge) level such that said respective amount of ESD (electro static discharge) from the body of said operator is not likely to damage said IC (integrated circuit), packages; and assigning an eighth flag to said operator if said respective amount of ESD (electro static discharge) from the body of said operator is greater than a predetermined ESD (electro static discharge) level such that said respective amount of ESD (electro static discharge) from the body of said operator is likely to damage said IC (integrated circuit) packages;

storing said respective flag assigned to each operator with said predetermined work shift and a date of said predetermined work shift in said database;

generating, at one of a plurality of computer systems networked in said production area and coupled to said database, a daily report with said respective flag assigned to each operator for said list of operators from data stored in said database, at said start of said predetermined work shift; and generating, at one of a plurality of computer systems networked in said production area and coupled to said database, a monthly report with said respective flag assigned to each operator for said list of operators, for each date of said predetermined work shift during a prior month, from data stored in said database;

wherein an IC (integrated circuit) package has an IC (integrated circuit) die that is damaged if an amount of ESD (electro static discharge) from an operator to said IC die is greater than a predetermined ESD (electro static discharge) level.

9. A system for monitoring ESD (electro static discharge) from each operator in a production area during production of articles of manufacture, the system comprising:

a first identification reader for reading a respective badge identification of each operator who checks into said production area;

a computer system having a data storage unit for storing said respective badge identification of each operator who checks into said production area in a first working file;

an ESD (electro static discharge) measuring unit for measuring an amount of ESD (electro static discharge) from a body of an operator;

a second identification reader for reading a respective badge identification of each operator who measures a respective amount of ESD (electro static discharge) from the body of said operator at said ESD (electro static discharge) measuring unit;

wherein said respective badge identification and said respective amount of ESD measured for each operator who measures said respective amount of ESD at said ESD measuring unit are stored in a second working file of said data storage unit of said computer system; and a database that stores data regarding a plurality of operators working in said production area;

wherein said computer system includes a data processor for generating a list of operators assigned to work during a predetermined work shift from data stored in said database, at a start of said predetermined work shift;

and wherein said data processor of said computer system assigns a respective flag to each operator in said list of operators assigned to work during said predetermined work shift, at said start of said predetermined work shift, by processing data from said first working file and said second working file stored in said data storage unit of said computer system, wherein said data processor further performs the steps of:

assigning a first flag to an operator if a respective badge identification of said operator is recorded in said first working file indicating that said operator has checked into said production area, and if said respective badge identification of said operator is recorded in said second working file indicating that said operator has measured a respective amount of ESD (electro static discharge) from the body of said operator at an ESD (electro static discharge) measuring unit;

assigning a second flag to an operator if a respective badge identification of said operator is not recorded in said first working file indicating that said operator has not checked into said production area, and if said respective badge identification of said operator is recorded in said second working file indicating that said operator has measured a respective amount of ESD (electro static discharge) from the body of said operator at an ESD (electro static discharge) measuring unit;

assigning a third flag to an operator if a respective badge identification of said operator is recorded in said first working file indicating that said operator has checked into said production area, and if said respective badge identification of said operator is not recorded in said second working file indicating that said operator has not measured a respective amount of ESD (electro static discharge) from the body of said operator at an ESD (electro static discharge) measuring unit; and assigning a fourth flag to an operator if a respective badge identification of said operator is not recorded in said first working file indicating that said operator has not checked into said production area, and if said respective badge identification of said operator is not recorded in said second working file indicating that said operator has not measured a respective amount of ESD (electro static discharge) from the body of said operator at an ESD (electro static discharge) measuring unit.

10. The system of claim 9, wherein when said first flag is assigned to said operator, the data processor of said computer system further performs the steps of:

assigning a fifth flag to said operator if said respective amount of ESD (electro static discharge) from the body of said operator is less than a predetermined ESD (electro static discharge) level such that said respective amount of ESD (electro static discharge) from the body of said operator is not likely to damage said articles of manufacture; and assigning a sixth flag to said operator if said respective amount of ESD (electro static discharge) from the body of said operator is greater than a predetermined ESD (electro static discharge) level such that said respective amount of ESD (electro static discharge) from the body of said operator is likely to damage said articles of manufacture.

11. The system of claim 10, wherein when said second flag is assigned to said operator, the data processor of the computer system further performs the steps of:

assigning a seventh flag to said operator if said respective amount of ESD (electro static discharge) from the body of said operator is less than a predetermined ESD (electro static discharge) level such that said respective amount of ESD (electro static discharge) from the body of said operator is not likely to damage said articles of manufacture; and assigning an eighth flag to said operator if said respective amount of ESD (electro static discharge) from the body of said operator is greater than a predetermined ESD (electro static discharge) level such that said respective amount of ESD (electro static discharge) from the body of said operator is likely to damage said articles of manufacture.

12. The system of claim 9, wherein said database stores said respective flag assigned to each operator with said predetermined work shift and a date of said predetermined work shift.

13. The system of claim 12, further comprising:

a plurality of computer systems, networked in said production area and coupled to said database, wherein one of said plurality of computer systems generates a report with said respective flag assigned to each operator for said list of operators, at said start of said predetermined work shift.

14. The system of claim 12, further comprising:

a plurality of computer systems networked in said production area and coupled to said database, wherein one of said plurality of computer systems generates a report with said respective flag assigned to each operator for said list of operators, for each date of said predetermined work shift during a prior month.

15. The system of claim 9, wherein said articles of manufacture includes an IC (integrated circuit) package having an IC (integrated circuit) die that is damaged if an amount of ESD (electro static discharge) from an operator to said IC die is greater than a predetermined ESD (electro static discharge) level.

* * * * *